United States Patent
Butcher et al.

(10) Patent No.: US 11,507,274 B2
(45) Date of Patent: Nov. 22, 2022

(54) SYSTEM AND METHOD TO USE DICTIONARIES IN LZ4 BLOCK FORMAT COMPRESSION

(71) Applicant: DELL PRODUCTS, LP, Round Rock, TX (US)

(72) Inventors: Andrew Butcher, Cedar Park, TX (US); Shyamkumar Iyer, Cedar Park, TX (US); Glen Sescila, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 57 days.

(21) Appl. No.: 17/077,885

(22) Filed: Oct. 22, 2020

(65) Prior Publication Data
US 2022/0129161 A1    Apr. 28, 2022

(51) Int. Cl.
*G06F 3/06* (2006.01)
*H03M 7/30* (2006.01)

(52) U.S. Cl.
CPC ............ *G06F 3/0608* (2013.01); *G06F 3/064* (2013.01); *G06F 3/0661* (2013.01); *G06F 3/0673* (2013.01); *H03M 7/3088* (2013.01)

(58) Field of Classification Search
CPC . H03M 7/3088; H03M 7/6017; G06F 3/0673; G06F 3/0608; G06F 3/064; G06F 3/0661
See application file for complete search history.

(56) References Cited

U.S. PATENT DOCUMENTS

| | | | | |
|---|---|---|---|---|
| 5,473,326 A  * | 12/1995 | Harrington | ......... | H03M 7/3086 341/51 |
| 5,635,932 A  * | 6/1997 | Shinagawa | ............. | G06T 9/005 341/51 |
| 9,973,210 B1 * | 5/2018 | Mahony | ............... | H03M 7/3086 |
| 10,540,384 B2 | 1/2020 | Maybee et al. | | |
| 2005/0071151 A1* | 3/2005 | Adl-Tabatabai | ........ | H03M 7/30 704/10 |

(Continued)

FOREIGN PATENT DOCUMENTS

| EP | 0729 237 A2  * | 1/1996 | ............... H03M 7/30 |
|---|---|---|---|
| WO | WO-9306661 A1 * | 4/1993 | ......... G06F 12/0802 |

OTHER PUBLICATIONS

C. Rogers and C. D. Thomborson, "Enhancements to Ziv-Lempel data compression," [1989] Proceedings of the Thirteenth Annual International Computer Software & Applications Conference, 1989, pp. 324-330, doi: 10.1109/CMPSAC.1989.65102.*

(Continued)

*Primary Examiner* — Pierre Michel Bataille
(74) *Attorney, Agent, or Firm* — Larson Newman, LLP

(57) ABSTRACT

An information handling system for compressing data includes a data storage device and a processor. The data storage device stores a dictionary and an uncompressed data block. The processor prepends the dictionary to the uncompressed data block, determines, from the uncompressed data block, a literal data string and a match data string where the match data string is a matching entry of the dictionary, and compresses the uncompressed data block into a compressed data block that includes the literal data string and an offset pointer that points to the matching entry.

20 Claims, 10 Drawing Sheets

(56) References Cited

U.S. PATENT DOCUMENTS

| | | | | |
|---|---|---|---|---|
| 2015/0379682 | A1* | 12/2015 | Golas | G06T 9/00 |
| | | | | 345/555 |
| 2016/0092492 | A1* | 3/2016 | Zimmer | H03M 7/3084 |
| | | | | 707/693 |
| 2019/0207624 | A1 | 7/2019 | Cassetti et al. | |
| 2020/0042220 | A1* | 2/2020 | Armangau | G06F 3/0604 |
| 2020/0394066 | A1* | 12/2020 | Senthil Nayakam | |
| | | | | H04L 12/4625 |
| 2020/0401405 | A1* | 12/2020 | Lasch | G06F 16/9027 |
| 2020/0403633 | A1* | 12/2020 | Lasch | G06F 16/2282 |

OTHER PUBLICATIONS

"Compressed String Dictionaries", Computer Science—Data Structures and Algorithms (cs.DS), Jan. 28, 2011.*

Arz, Julian • Fischer, Johannes, "LZ-Compressed String Dictionaries", Computer Science—Data Structures and Algorithms (cs.DS), May 3, 2013.*

* cited by examiner

LZ4 Frame
600

| Magic Number (4 bytes) 602 | Frame Descriptor (3-15 bytes) 604 | Data 606 | End Mark (4 bytes) 608 | Checksum 610 |

Frame Descriptor
604

| FLG (1 byte) 620 | BD (1 byte) 622 | Content Size (0-8 bytes) 624 | Dictionary ID (0-4 bytes) 626 | Header Checksum (1 byte) 628 |

FLG Byte
620

| Version (7-6) 630 | Block Indep. (5) 631 | Block Checksum (4) 632 | Content Size (3) 633 | Content Checksum Flag (2) 634 | Reserved (1) 635 | Dictionary ID Flag (0) 636 |

*FIG. 6*
*(Prior Art)*

SYSTEM AND METHOD TO USE DICTIONARIES IN LZ4 BLOCK FORMAT COMPRESSION

FIELD OF THE DISCLOSURE

This disclosure generally relates to information handling systems, and more particularly relates to improving data compression ratios of LZ4 block format compression in a Smart Data Accelerator Interface (SDXI) device.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

An information handling system for compressing data may include a data storage device and a processor. The data storage device may store a dictionary and an uncompressed data block. The processor may prepend the dictionary to the uncompressed data block, determine, from the uncompressed data block, a literal data string and a match data string where the match data string is a matching entry of the dictionary, and compress the uncompressed data block into a compressed data block that includes the literal data string and an offset pointer that points to the matching entry

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which:

FIG. 6 illustrates a compression frame in an LZ4 compression algorithm according to the prior art;

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
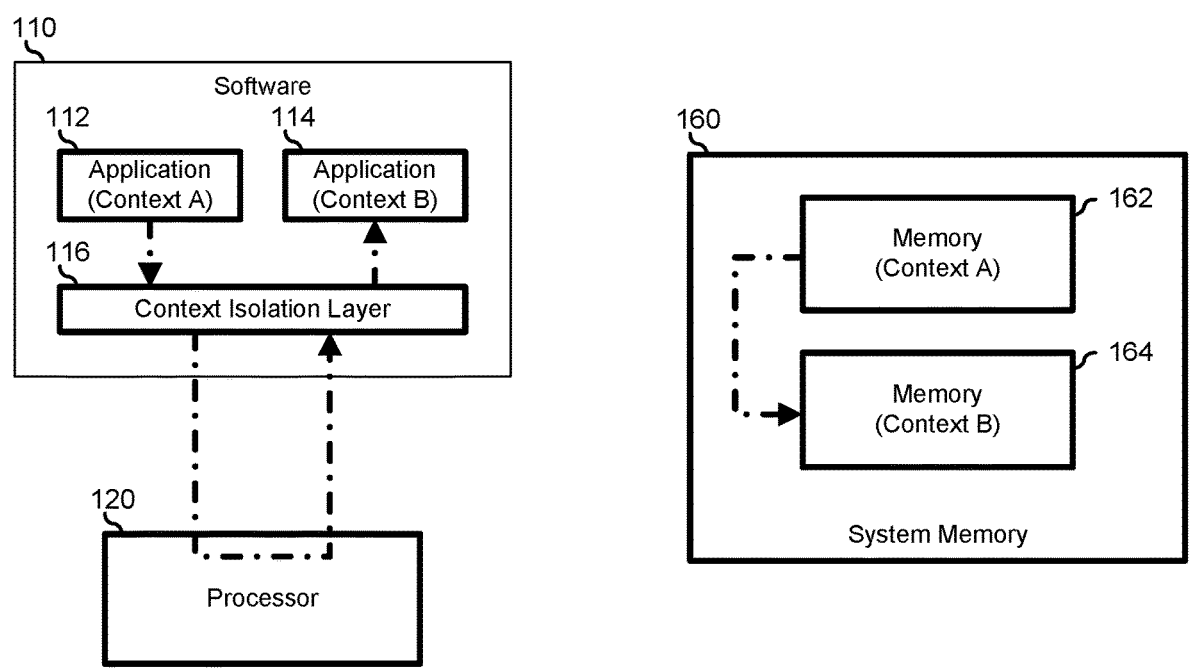
FIG. 1 is a block diagram of an information handling system according to the prior art.

FIG. 1 illustrates an information handling system 100 that utilizes a data exchange architecture in accordance with the prior art. Information handling system 100 includes software 110, a processor 120, and a system memory 160. Software 110 represents machine-executable code stored on information handling system 100 that is executable by processor 120, and includes a first application 112 that is associated with a first context, a second application 114 that is associated with a second context, and a context isolation layer 116. Application 112 is associated with one or more address ranges in the system physical address space (SPA) provided by system memory 160. The address ranges associated with application 112 are collectively shown as a portion 162 of system memory 160. Similarly, application 114 is associated with one or more address ranges in system memory 160, collectively shown as a portion 164 of the system memory. Context isolation layer 116 represents one or more agent, application program interface (API), utility, or the like that operates to maintain the isolation between memory 162 and 164. Examples of context isolation layer 116 may include a system Basic Input/Output System (BIOS) or Universal Extensible Firmware Interface (UEFI), hereinafter referred to collectively as "BIOS," that operates to provide isolated memory ranges for system operations, a virtual desktop system that isolates various memory ranges for the use of multiple users of the virtual desktop system, a hypervisor or virtual machine manager (VMM) that sets up and maintains virtual machines and their associated memory ranges, or the like.

In operation, when applications 112 and 114 are instantiated on information handling system 100, context isolation layer 116 allocates memory 162 and 164 to the use of their respective applications. In addition, when applications 112 and 114 need to interact, for example by moving data from one application to the other, context isolation layer 116 operates to manage the transfer of data between memory 162 and 164.

Note here that the data exchange architecture of information handling system 100 requires the execution of code associated with context isolation layer 116 by processor 120 in order to perform data transfers between memory 162 and memory 164. As such, the prior art data exchange architecture imposes a processing burden on processor 120, thereby reducing the processor cycles available for performing other tasks associated with applications 112 and 114. It will be understood that this processing overhead may be partially mitigated by the inclusion of Direct Memory Access (DMA) hardware in information handling system 100. However, it will be further understood that such DMA hardware is typically a vendor specific add-on, and access to such DMA hardware by applications 112 and 114 directly is typically difficult. In particular, even with the inclusion of DMA hardware, processor 120 is still needed to set up DMA transfers, and context isolation layer 116 is still needed in its role as gatekeeper to system memory 160.

Figure 2:
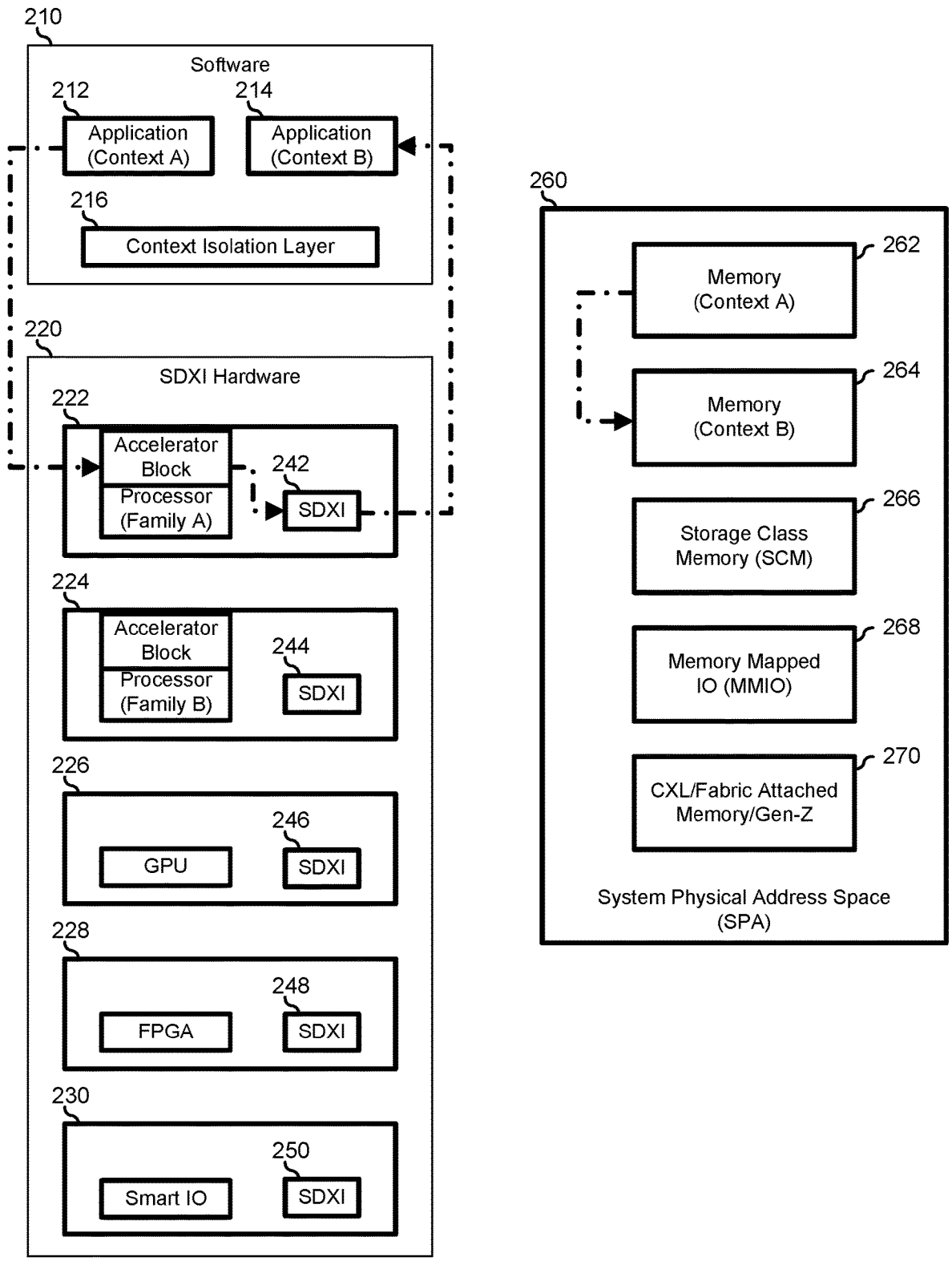
FIG. 2 is a block diagram of an information handling system according to an embodiment of the current disclosure.

FIG. 2 illustrates an information handling system 200 that utilizes a Smart Data Accelerator Interface (SDXI) data exchange architecture in accordance with an embodiment of the current disclosure. Information handling system 200 includes software 210, SDXI hardware 220, and a system physical address space (SPA) 260. SDXI hardware 220 includes a first family of processors 222 and an associated SDXI interface 242, a second family of processors 224 and an associated SDXI interface 244, one or more Graphics Processor Unit (GPU) 226 and an associated SDXI interface 246, a Field-Programmable Gate Array (FPGA) 248 and an associated SDXI interface 248, and a Smart I/O device 230 and an associated SDXI interface 250. Software 210 is similar to software 110, and represents machine-executable code stored on information handling system 200 that is executable by a processor such as one or more of processors 222 and 224. Software 210 includes a first application 212 that is associated with a first context, a second application 214 that is associated with a second context, and a context isolation layer 216. Software 210 may include functions and features similar to software 110, as described above. In particular, software 210 may implement the data exchange architecture of information handling system 100, as needed or desired. As such, application 212 is associated with one or more address ranges in SPA 260, with the associated address ranges shown as a portion 262 of the SPA, and application 214 is associated with one or more address ranges in the SPA, with the associated address ranges shown as a portion 264 in the SPA. Here too, context isolation layer 216 is similar to context isolation layer 116, representing one or more agent, API, utility, or the like that operates to maintain the isolation between memory 262 and 264. As such, context isolation layer 216 operates to allocate memory 262 and memory 264 when respective application 212 and application 214 are instantiated on information handling system 200, and the context isolation layer prevents the use of various memory ranges by unauthorized applications.

The SDXI data exchange architecture represents an industry effort to expand and standardize data movement protocols and hardware accelerator interfaces. As such, information handling system 200 broadens the scope of data exchanges on both the hardware side and the memory side. In particular, on the hardware side, SDXI hardware 220 incorporates various types of processing elements, co-processors, accelerators, and other data movers, as typified by processor families 222 and 224, GPU 226, FPGA 228, and Smart I/O device 230. On the memory side, SPA 260 is expanded to include not only the system physical memory, as typified by memory 262 and memory 264, but also separately attached memory, such as Storage Class Memory (SCM) devices 266, memory mapped I/O (MMIO) devices 268, and memory architectures, such as Compute Express Link (CXL) and Gen-Z memory interfaces, fabric-attached memory, and the like, as shown collectively as memory device 270. In particular, the SDXI data exchange architecture treats all of memory devices 262, 264, 266, 268, and 270 as a single SPA 260. The SDXI data exchange architecture then provides standardized interfaces for data movement between software 210, SDXI hardware 220, and SPA 260. Here, SDXI interfaces 242, 244, 246, 248, and 250 represent hardware and software associated with their respective hardware devices, such that a common set of SDXI commands, instructions, procedures, calls, and the like, referred to hereinafter as "SDXI commands," can be made to the hardware devices. Here, the details of implementing the various SDXI commands can be left to the design requirements and desires of the various hardware manufacturers. In this way, the SDXI data exchange architecture remains extensible and forward-compatible with new hardware or memory developments, and is independent of actual data movement details, data acceleration implementations, and the underlying I/O interconnect technology. The SDXI commands support: data movement between different address spaces including user address spaces located within different virtual machines; data movement without mediation by privileged software once a connection has been established; an interface and architecture that can be abstracted or virtualized by privileged software to allow greater compatibility of workloads or virtual machines across different servers; a well-defined capability to quiesce, suspend, and resume the architectural state of a per-address-space data mover to allow "live" workload or virtual machine migration between servers; mechanisms to enable forwards and backwards compatibility across future specification revisions, allowing software and hardware designed to different specification revisions to interoperate; the ability to incorporate additional offloads in the future leveraging the architectural interface; and a concurrent DMA model. As used herein, SDXI will be understood to represent any present or future specifications, specification revisions, articles, working papers, or other publications of the Smart Data Accelerator Interface (SDXI) Technical Working Group (TWG) of the Storage Networking Industry Association (SNIA).

Figure 3:
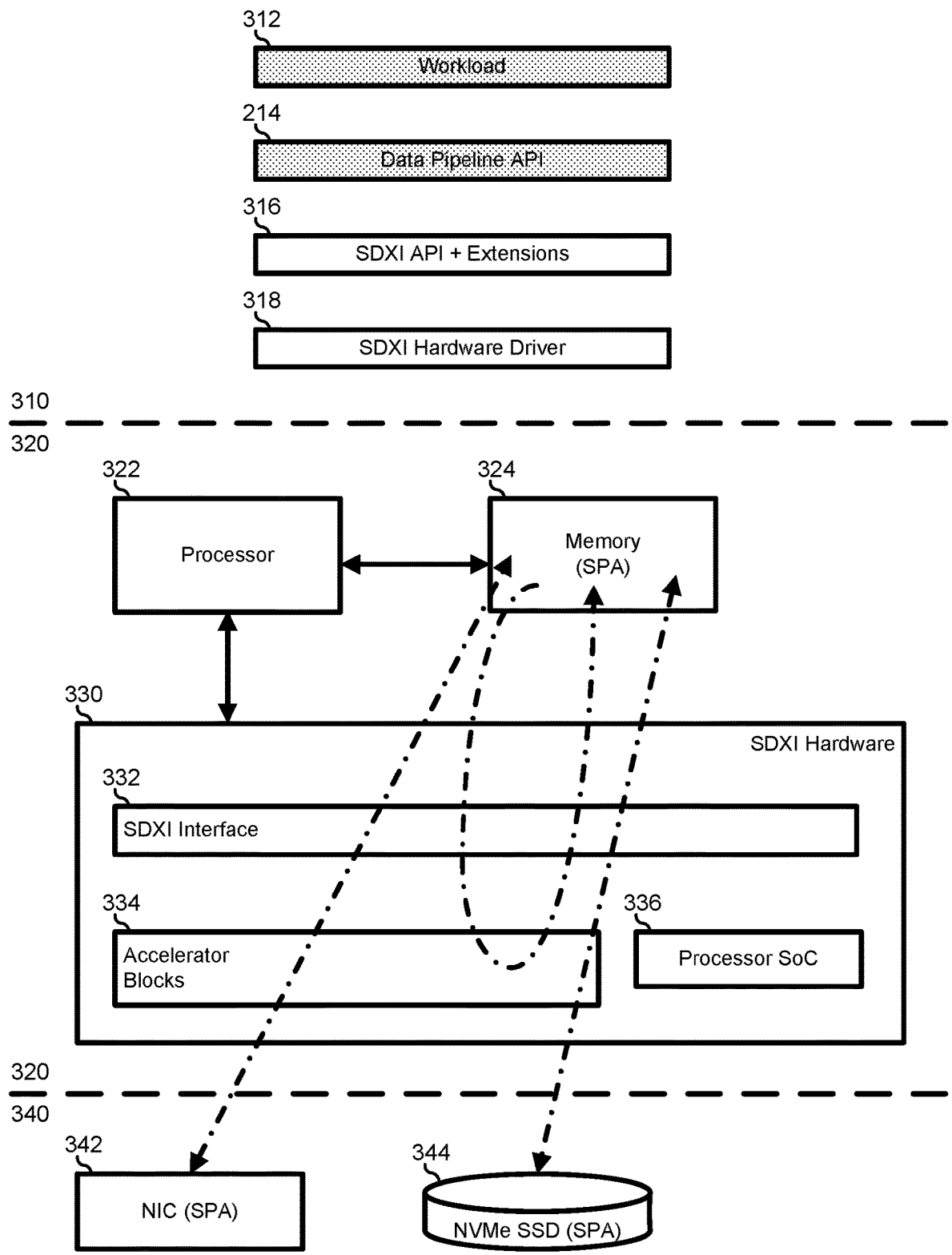
FIG. 3 is a block diagram of an information handling system according to another embodiment of the current disclosure.

FIG. 3 illustrates an embodiment of an information handling system 300 similar to information handling system 200. Information handling system 300 includes a software layer 310, a hardware layer 320, and an attachment layer 340. Software layer 310 is similar to software 210, and includes a workload 312, a data pipeline API 314, a SDXI API 316, and a SDXI hardware driver 318. Hardware layer 320 includes a processor 322, a memory (SPA) 324, and a SDXI hardware device 330. Attachment layer 340 includes a Network Interface Card (NIC) 342 and a Non-Volatile Memory-Express (NVMe) Solid State Drive (SSD) 344. NIC 342 and SSD 344 are each extensions of the SPA space of information handling system 300.

Workload 312 and data pipeline API 314 operate similarly to applications 212 and 214, and context isolation layer 216, and represent elements of a typical information handling system that perform the processing task of the information handling system. In particular, workload 312 operates to perform various operations on data and to move data between different storage and processing elements of information handling system 300, and may make various service calls to data pipeline API to assist in such processing operations and data moves. SDXI API 316 represents an API configured to provide the core operability as specified by a particular revision of an SDXI specification. In addition, SDXI API 316 provides additional extensions to the core operability of the particular SDXI specification, as described below. When workload 312 or data pipeline API 314 invoke SDXI API 316 for the various data operations or data moves, the SDXI API operates to direct SDXI hardware driver 318 to elicit SDXI hardware 330 to perform one or more of the invoked operations or data moves, as needed or desired. In this regard, SDXI hardware driver 318 and SDXI hardware 330 are closely associated with each other.

As such, SDXI hardware 330 represents a wide variety of different types of hardware that can be utilized to perform the SDXI core operations and extensions as described herein. An example of SDXI hardware 330 may include accelerator blocks within a general purpose processor or processor family, such as a CPU or the like, a purpose specific processor, such as a GPU or the like, a logic-based device or state-based device, such as a FPGA, a Complex Programmable Logic Device (CPLD) or the like, a smart I/O device that provides in-line data processing in the course of I/O operations, such as a smart NIC, a Host Bus Adapter (HBA), a storage controller such as a RAID controller, a Network Attached Storage (NAS) device, a Storage Area Network (SAN) controller, or the like, or another processing device, as needed or desired. Here, it will be understood that, SDXI hardware 330 may be configured to provide operations consistent with its type, but that are not specifically associated with its SDXI functionality. For example, where SDXI hardware 330 represents a FPGA type of device, it will be understood that the FPGA device may be invoked to provide functionality of a more general nature, in addition to the SDXI functionality as described herein.

SDXI hardware 330 includes a SDXI interface 332, various accelerator blocks 334, and a processor SoC 336. Accelerator blocks 334 may represent hardware accelerators, logic-based or state-based accelerators, or other configurable or pre-configured accelerator functions, as needed or desired. As described further below, SDXI hardware 330 may operate in some embodiments to provide enhanced data pipelining operations. For example, SDXI hardware 330 may provide data movement: between different locations in memory 324, to and from the memory and a network connected to NIC 342, to and from the memory and NVMe SSD 344, to and from the network and the NVMe SSD, and between different locations in the NVME SSD. SDXI hardware 330 may further operate in some embodiments to provide enhanced data transformation operations on data, either as atomic operations or in conjunction with the data movement utilizing various accelerator blocks 334. In particular, various embodiments of SDXI hardware 330 may provide: data compression/decompression, data encryption/decryption, data checksums, hash functions such as SHA-256 hashes and the like, RAID functions, erasure coding, and the like. Other functions that may be performed by SDXI hardware 330 may include data deduplication, LZ-4 compression, compression ratio and block size optimization, data operation chaining, multi-point data movement, uncompressible block handling, and query analytics.

Figure 4:
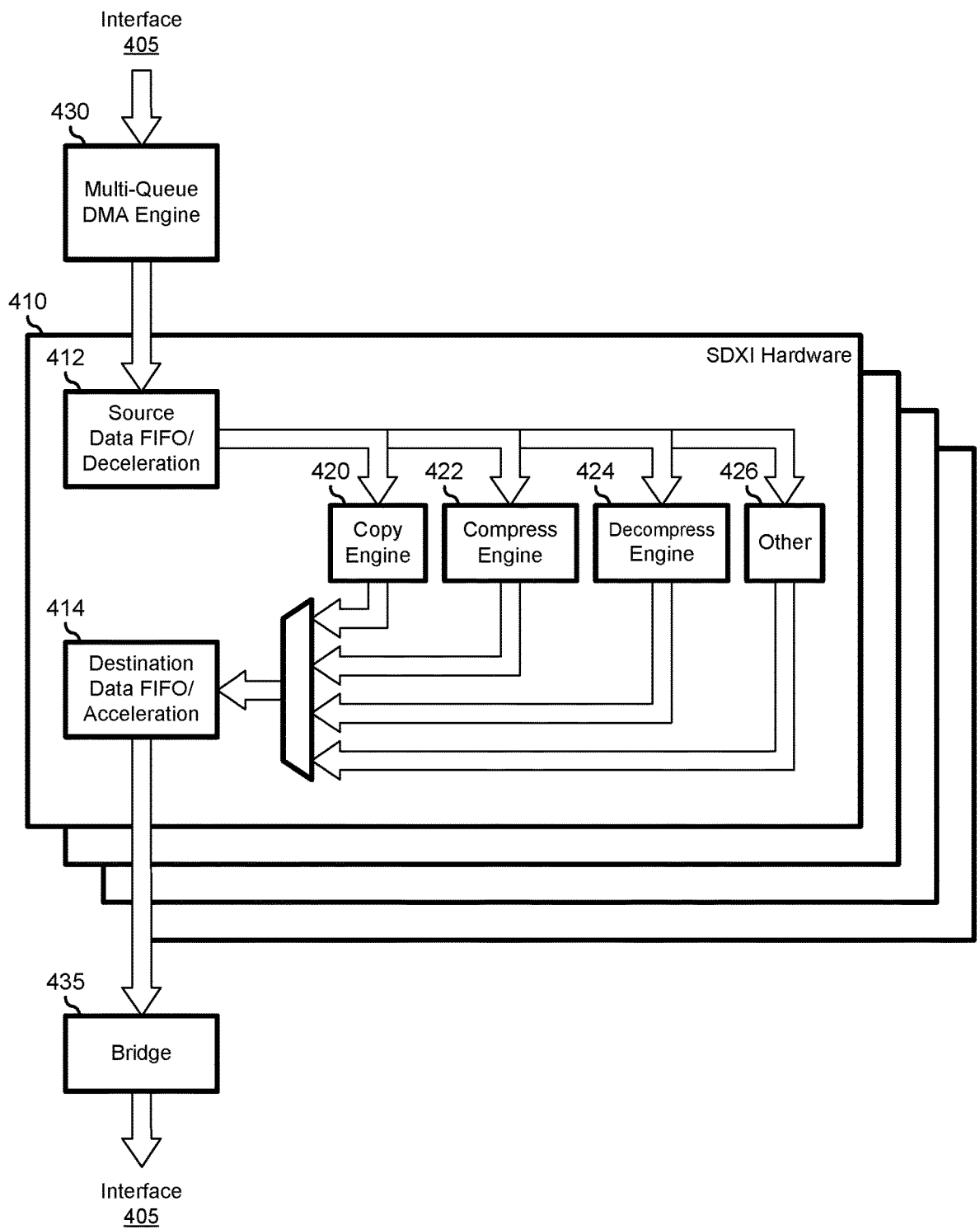
FIG. 4 is a block diagram of an information handling system according to another embodiment of the current disclosure.

FIG. 4 illustrates an embodiment of an information handling system 400 similar to information handling systems 200 and 300. Information handling system 400 includes a processor complex (not illustrated) that provides a communication interface 405 to provide data communications with multiple SDXI hardware devices 410. An example of interface 405 may include a Third Generation Peripheral Component Interconnect-Express (PCIe Gen3) x16 (16-lane) communication link, a PCIe Gen3 communication link with greater or fewer lanes (e.g., x4, x8, x32), or another communication interface, as needed or desired. Information handling system 400 further includes a multi-queue Direct Memory Access (DMA) engine 430, and a data bridge 435. Each of the SDXI hardware devices 410 are connected to receive data and instructions from DMA engine 430, and to provide data and control information to data bridge 435. DMA engine 430 provides dynamic allocation of parallel data flows to the multiple SDXI hardware devices 410, as needed by the processing tasks operating on information handling system 400. The data flows are provided to DMA engine 430 via interface 405, and may be received from memory or storage devices within the SPA of information handling system 400. Data bridge 435 receives the data flows from SDXI hardware devices 410 and communicates the data flows via interface 405 to the memory and storage devices within the SPA of information handling system 400.

Each of the SDXI hardware devices 410 may be understood to be similar hardware devices, such as where the SDXI hardware devices are each provided by a common manufacturer and are a common device type. Here, DMA engine 430 may allocate data flows to the various SDXI hardware devices 410 based upon factors unrelated to the particular device type of the SDXI hardware devices. For example, DMA engine 430 may allocate data flows based upon the resource loading or availability of each of the SDXI hardware devices, the power level or power state of each of the SDXI hardware devices, or other factors not directly related to the type of the SDXI hardware devices, as needed or desired. Further, each of SDXI hardware devices 410 may be understood to be different hardware devices, such as where the SDXI hardware devices are provided by different manufacturers and are different device types. Here, DMA engine 430 may allocate data flows to the various SDXI hardware devices 410 based upon the type of each of the SDXI hardware devices. For example, where a particular SDXI hardware device 410 contains a network function, DMA engine 430 may allocate network based data flows to that particular SDXI function. On the other hand, where a different SDXI hardware device contains a storage controller function, DMA engine 430 may allocate storage based data flows to the other SDXI function.

SDXI hardware device 410 is illustrated as including a source data FIFO/deceleration module 412, a destination data FIFO/acceleration module 414, a copy engine 420, a compression engine 422, a decompression engine 424, and one or more additional engines 426. The configuration illustrated by SDXI hardware device 410 will be understood to be typical, and representative of a wide range of device configurations, as needed or desired. As such, the particular configuration illustrated by SDXI hardware device 410 should not be understood to be limiting on the type, nature, features, configuration, or functionality of SDXI hardware devices in general. Other functions that may be performed by SDXI hardware 410 may include data deduplication, LZ-4 compression, compression ratio and block size optimization, data operation chaining, multi-point data movement, uncompressible block handling, and query analytics.

The inventors of the current invention have understood that key measures for evaluating compression algorithms may include determining the compression ratio that different compression algorithms achieve, and determining the time to compress data with the different compression algorithms. It has been further noted that data compression in storage products, perform compression on standardized data block sizes, such as on 4 kilobyte (KB) boundaries. However, such small data block sizes permit little data history with which to search for matches with the compression algorithms, which can result in low compression ratios. 1Hence comparisons of compression ratios for the different compression algorithms becomes even more important for optimizing storage performance. In other applications, such as streaming data services, optimizing compression ratios may be less important than determining the compression speed of different compression algorithms.

Figure 5:
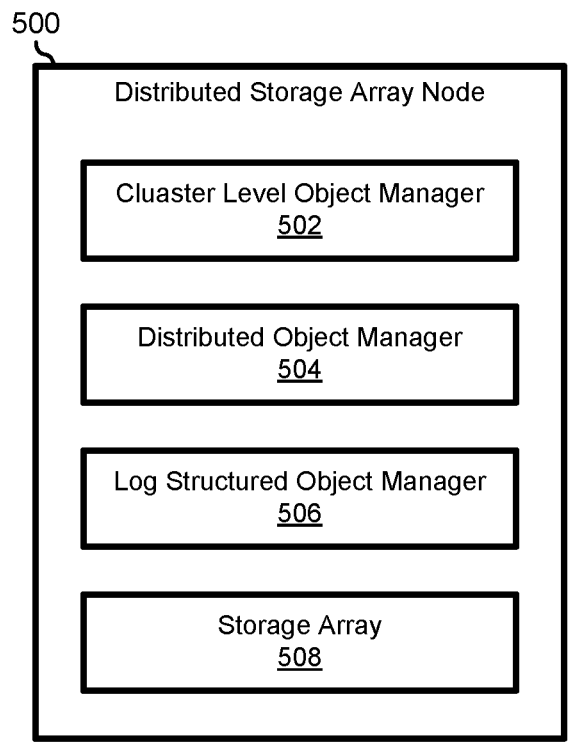
FIG. 5 is a block diagram of a node of a distributed storage array node according to an embodiment of the current disclosure.

FIG. 5 illustrates a distributed storage array node 500, including a cluster level object manager (CLOM) 502, a distributed object manager (DOM) 504, a log structured object manager (LSOM) 506, and a storage device 508. Node 500 represents a storage virtualization architecture that permits operating systems (OSs) and virtual machine managers (VMMs) to pool the storage resources of associated local storage devices. As such, it will be understood that node 500 will typically recognized as a single node of a multi-node distributed storage array, where the local storage devices of each node are pooled together. An example of a distributed storage array may include a VMWare virtual Storage Area Network (vSAN), or the like.

CLOM 502 is a process running on computing resources of node 500 that operates to manage objects stored on the distributed storage array. In particular, CLOM 502 validates that objects can be created based on policies and available resources of node 500, ensures object compliance with the policies and standards of the distributed storage array, defines the creation, deletion, modification, and migration of objects, and works with other nodes of the distributed storage array to balance the loads between the nodes and conduct re-balancing of the loads. DOM 504 is a process running on computing resources of node 500 that operates to receive instructions from the CLOM and other DOMs running on other nodes in the distributed storage array, and to communicate with LSOM 506 to create local components of an object, and to coordinate the creation of all of the components of the object with the other DOMs in the other nodes. Each object stored in the distributed storage array is owned by a unique DOM, and the DOM owner determines what processes are allowed to be performed on the owned object. LSOM 506 operates as instructed by DOM 504. In particular, LSOM 506 provides read and write buffering, encryption and decryption of the objects, data compression of the objects for storage on storage device 508 and decompression when the objects are read from the storage device, health monitoring for the storage device, and the like.

The inventors of the current invention have understood that key measures for evaluating compression algorithms may include determining the compression ratio that different compression algorithms achieve, and determining the time to compress data with the different compression algorithms. It has been further noted that data compression in storage products, such as virtual distributed storage array controllers, perform compression on standardized data block sizes, such as on 4 kilobyte (KB) boundaries. However, such small data block sizes permit little data history with which to search for matches with the compression algorithms, which can result in low compression ratios. Hence comparisons of compression ratios for the different compression algorithms becomes even more important for optimizing storage performance. In other applications, such as streaming data services, optimizing compression ratios may be less important that determining the compression speed of different compression algorithms. Moreover, the inventors have understood that a commonly used compression algorithm, the LZ4 compression algorithm, permits the use of compression dictionaries on frames of multiple data blocks, but does not provide for the use of compression dictionaries on individual data blocks. Further, typical distributed storage array designs may not utilize frame compression, but, for simplicity and development cost, may opt to utilize only block format compression with the LZ4 compression algorithm.

FIG. 6 illustrates a LZ4 frame 600 as provided by the LZ4 compression algorithm, as is known in the prior art. Here, LZ4 frame 600 includes a magic number field 602, a frame descriptor field 604, data 606, an end mark field 608, and a content checksum field 610. Magic number field 602 is a fixed value signature field that is four (4) bytes, and includes the value, 0x184D2204. Frame descriptor field 604 is a 3-15 byte field that will be described further below. Data field 606 includes the data blocks of the compressed data. End mark field 608 indicates the end of LZ4 frame 600, and content checksum field 610 verifies the that the full content has been decoded correctly. Note that content checksum field 610 is only present when its associated flag is set in frame descriptor 604, as described below.

Frame descriptor 604 is shown in detail, including a FLG field 620, a BD field 622, a content sized field 624, a dictionary ID field 626, and a header checksum field 628. FLG field 620 is a one (1) byte field, and will be described further below. BD field 622 is a one (1) byte field, and includes a bit field that encodes a maximum data block size. Content size field 624 is a zero to eight (0-8) byte field that represents the size of the original (uncompressed) data. Dictionary ID field 626 is a zero to four (0-4) byte field that stores the identification of a compression dictionary. A compression dictionary is utilized to compress known input sequences. Here, a particular input sequence that is represented in a dictionary entry can be encoded as an index into the dictionary, thereby permitting a more compact compression of the input data. It will be understood that the same dictionary must be utilized in compressing the decompressing the data. It will be further understood that, within a single frame, a single dictionary can be defined. When the frame descriptor defines independent blocks, each block will be initialized with the same dictionary. If the frame descriptor defines linked blocks, as described further below, the dictionary will only be used once, at the beginning of the frame. Header checksum field 628 is a one (1) byte field that provides a checksum of the descriptor fields of frame descriptor 604.

FLG byte 620 is shown in detail, including a version field 630, a block independence flag 631, a block checksum flag 632, a content size flag 633, a content checksum flag 634, a reserved bit 635, and a dictionary ID flag 636. Version field 630 is a 2-bit field (bits 7 and 6) that must be set to 0b01. Block independence flag 631 (bit 5) is set to "1" when the blocks are independent and is cleared to "0" when each block depends on the previous blocks, and hence indicates that the blocks are to be decompressed sequentially. Block dependency improves compression ratio, especially for small blocks. On the other hand, it makes random access or multi-threaded decoding impossible. If block checksum flag 632 (bit 4) is set to "1," each data block will be followed by a 4-bytes checksum, calculated by using the xxHash-32 algorithm on the raw (compressed) data block. The intention is to detect data corruption (storage or transmission errors) immediately, before decoding. Block checksum usage is optional. Hence if block checksum flag 632 is cleared to "0," the block data is not followed by checksum information. When content size flag 633 (bit 3) is set to "1," the uncompressed size of data included within the frame will be present as an 8-byte value. If content checksum flag 634 (bit 2) is set to "1," a 32-bit content checksum will be appended after the EndMark. If dictionary ID flag 636 (bit 0) is set to "1," a 4-byte Dictionary ID field will be present, after the descriptor flags and the content size.

It will be understood that, in some circumstances, it may be preferable to append multiple frames, for example in order to add new data to an existing compressed file without re-framing it. In such a case, each frame has its own set of descriptor flags. Each frame is considered independent. The only relation between frames is their sequential order. Note that, utilizing the frame mechanism in the LZ4 specification, it is possible to apply a dictionary to a single storage block of data of a distributed storage array, the use of the frame mechanism is better suited, particularly with respect to the use of dictionaries, to larger LZ4 block sizes. However, the utilization of the LZ4 frame mechanism introduces significant complexity to the handling of data that may not be desirable in some applications. For example, typical distributed storage array products do not opt to utilize the LZ4 frame mechanism, but rely on LZ4 block compression, as described further below. It will be further understood that the native LZ4 block format does not permit the identification of dictionaries, but rather utilizes a circular buffer called a sliding window in compressing and decompressing data. Here, as used henceforth, when referring to a block of data within the context of distributed storage array and the smallest chunk of data to be manipulated thereby, the term "storage block" may be used. In contrast, as used henceforth, when referring to a block of compression data within the context of the LZ4 specification, the term "LZ4 block" may be used.

Figure 7:
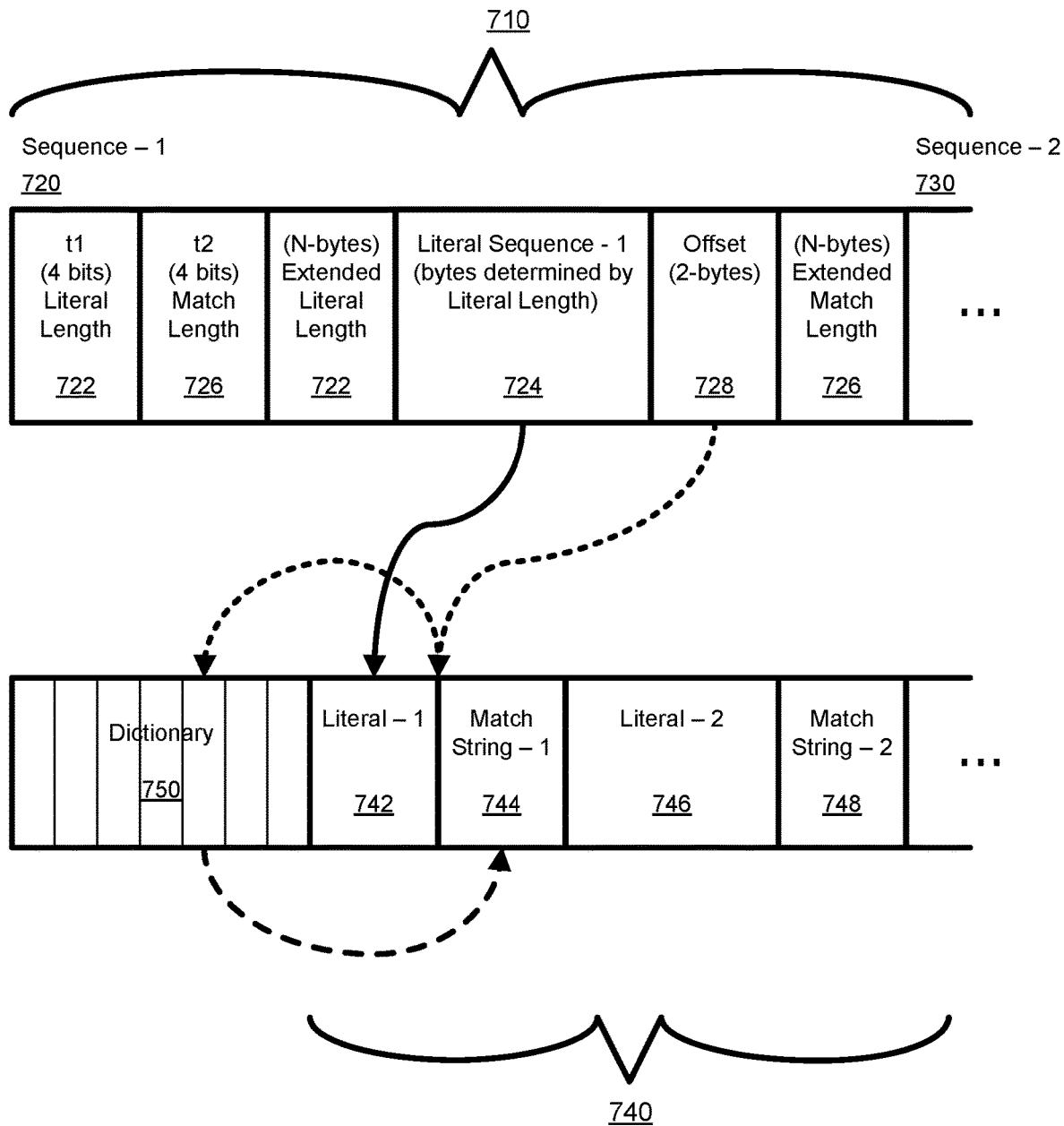
FIG. 7 illustrates a compression block in a modified LZ4 compression algorithm according to an embodiment of the current disclosure.

FIG. 7 illustrates a compressed LZ4 block 710 and an uncompressed storage block 740. LZ4 block 710 is composed of sequences, of which a first sequence 720 and a second sequence 730 are shown. LZ4 compressed data 710 is composed of an unspecified number of sequences, the number depending upon the degree to which storage block 740 is compressible. It will be understood that the data of storage block 740 will consist of alternating sequences of data strings that can not be compressed, followed by data strings that can be compressed. The strings that can not be compressed are called literals, and the strings that can be compressed are called matches. Hence storage data 740 is shown including a first exemplary literal 742 followed by a first exemplary match 744, followed by a second exemplary literal 746, followed by a second exemplary match 748, and followed by further combinations of literals and matches, as needed. Note that the raw data is not in any way configured, ordered, or defined in accordance with the sequences of literals and matches. Rather, the data may be viewed as such a sequence of literals and matches only by operation of the compression and decompression of the data under the LZ4 block compression algorithm. Block data 740 is illustrated with a dictionary 750 concatenated at the front of the data, as will be described below.

In the native LZ4 block compression algorithm, each literal/match pair is defined by a sequence. Hence the consecutive data of literal 742 and match 744 is compressed by the LZ4 block compression algorithm to provide sequence 720, the consecutive data of literal 746 and match 748 is compressed by the LZ4 block compression algorithm to provide sequence 730, and so on. Exemplary sequence 720 includes literal length fields 722, a literal data filed 724, match length fields 726, and a match offset field 728. The literal data is defined as having a particular length, as defined by literal length fields 722, and the actual data of the literal as found in literal data field 724. The definition of the length of the literal data 724 is defined by literal length fields 722 is known in the art, and will not be further described herein, except as needed to illustrate the current embodiments. The match data is defined by match length fields 726 and match offset 728. Here, match offset 728 refers to a negative offset back into a circular buffer, or sliding window, of previously encountered data. The definition of the length of a match (match length fields 726), the utilization of the sliding window, and the determination of offset 728 are known in the art, and will not be further described herein, except as needed to illustrate the current embodiments. Thus, it will be understood that for each sequence, under the native LZ4 block compression algorithm, an offset will only point back into the circular buffer to recently encountered data, and that thus the ability to find matches is limited to finding data duplicates that are proximate to each other, that is, that are within the size of the circular buffer. Moreover, for the first sequence, and possibly other early sequences, offset 728 will not point back to before the first data of the block to be compressed, because the sliding window will not include valid data for prior to that point. Thus the degree of compressibility of data under the native LZ4 block compression algorithm is limited when no dictionary is used.

FIG. 7 further illustrates an embodiment of the current disclosure whereby a dictionary 750 may be utilized in compressing the data of storage block 740 in a LZ4 block compression algorithm. Here, dictionary 750 is logically prepended to storage block 740. The LZ4 block compression algorithm then begins compression with literal 742, as described above. However, in addition to the use of the sliding window for defining matches, the LZ4 block compression algorithm also utilizes dictionary 750 to search for larger duplicate strings. Here, the LZ4 compression algorithm may determine whether a match based upon the sliding window provides greater compression than a match based upon a dictionary entry, or vice versa. Here, if the match based upon the sliding window provides the greater compression, then the LZ4 block compression algorithm populates the offset field to point into the sliding window. However, if the match based upon the dictionary entry provides the greater compression, then the LZ4 block compression algorithm populates the offset field with a value that is greater than the first data of storage block 740, and that indexes into the matching entry of dictionary 750. In this way, the native LZ4 block compression algorithm provides for the use of dictionaries in the compression algorithm.

Note that the use of a common dictionary may simplify the compression and decompression of data across the nodes of the distributed storage array. However, it will be understood that selecting different dictionary for different types of data may yield greater data compression than may be achieved with a common dictionary. That is, different data types may be known to have different commonly recurring strings of data, and so, different dictionaries may be implemented to take advantage of the known recurring strings. However, in the LZ4 block compression algorithm as described above, no method is described for defining different dictionaries within the compression block format.

Figure 8:
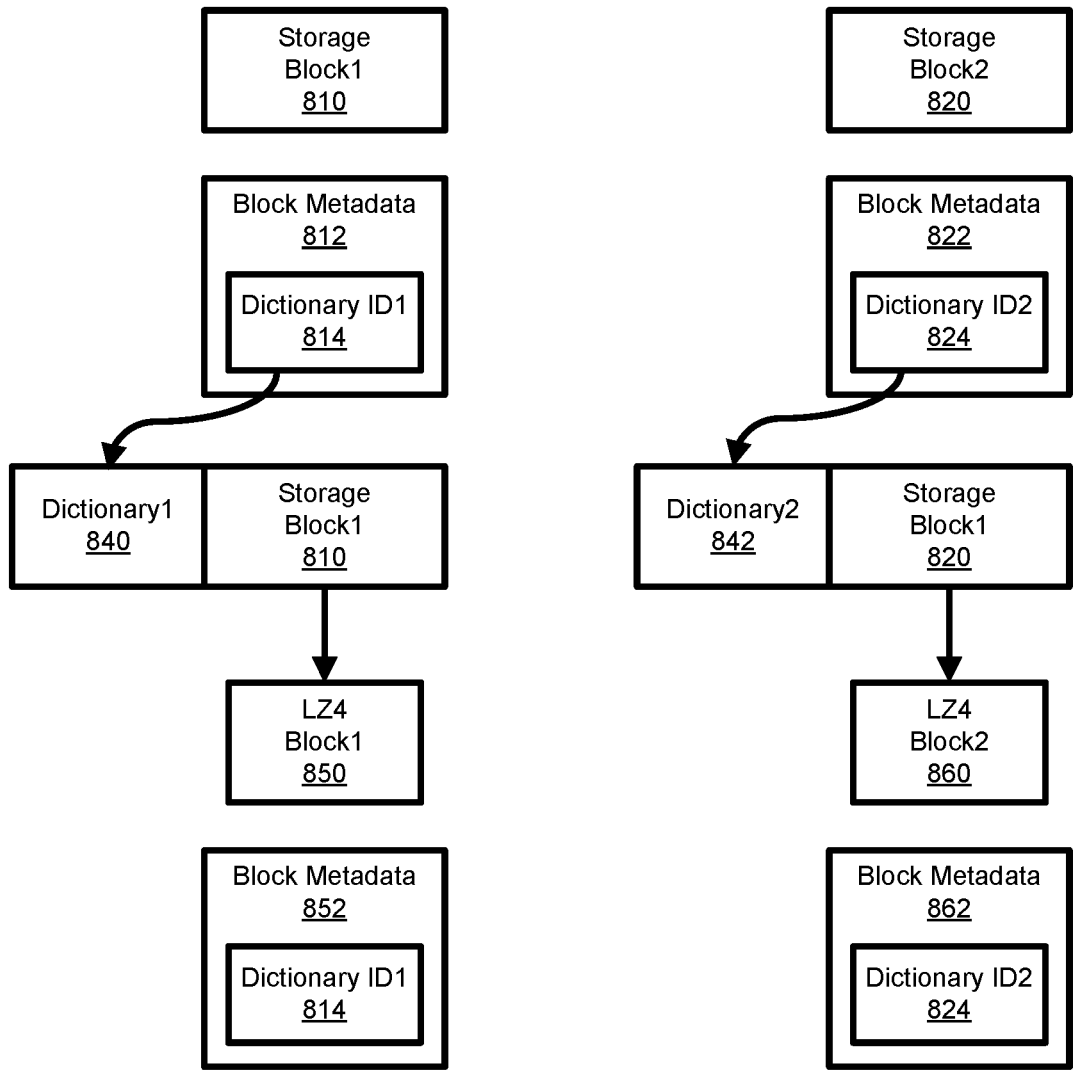
FIG. 8 illustrates a method for compressing data utilizing the modified LZ4 compression algorithm of FIG. 7.
Figure 9:
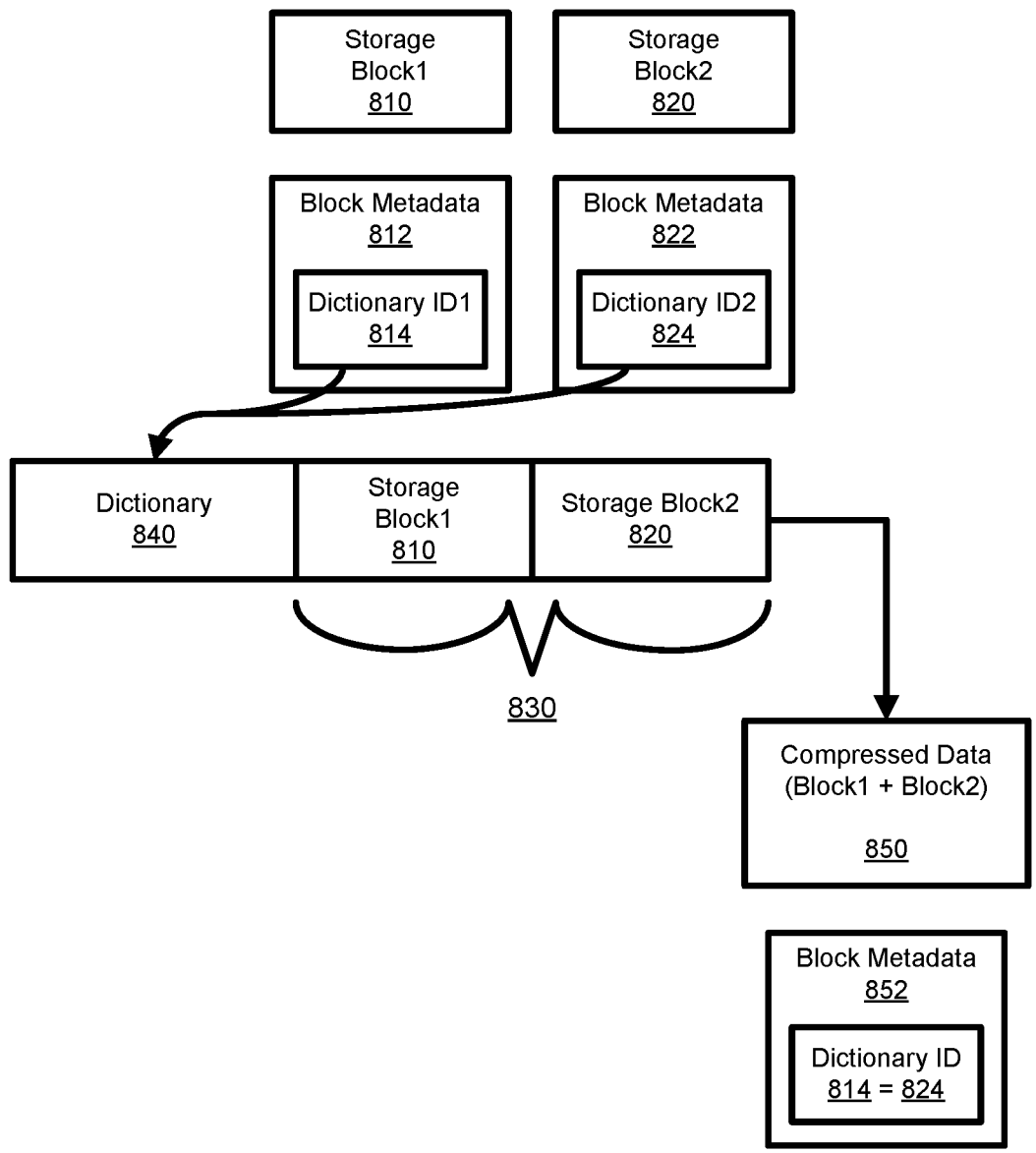
FIG. 9 illustrates another method for compressing data utilizing the modified LZ4 compression algorithm of FIG. 7.

FIGS. 8 and 9 illustrate embodiments of the modified LZ4 block compression algorithm.

In a particular embodiment, a dictionary ID is embedded within an existing field in a LZ4 compressed sequence. For example, if the literal length of the first sequence is set to 0, the offset field can be used to store a two-byte identifier. Normally the literal length can not store a 0 value 0 in the first sequence, since that would not provide data for the first match. Here, the value 0 in literal length of the first sequence indicates that a dictionary ID is being provided, instead of a literal and match set that is normally provided in an LZ4 sequence. In another embodiment, if the offset field in the first sequence is 0, then the extended match length portion of the sequence can be used to store a two-byte dictionary ID. In either case, the dictionary ID is encoded in the compressed data rather than stored in the metadata.

FIG. 8 illustrates an embodiment of a modified LZ4 block compression algorithm for compressing storage blocks 810 and 820. As created on a distributed storage array, storage block 810 includes metadata 812, and the metadata includes a dictionary ID 814. Here, dictionary ID 814 identifies a dictionary 840 that is logically prepended to storage block 810 during compression. The modified LZ4 block compression algorithm is then utilized to compress storage block 810 into LZ4 block 850. LZ4 block 850 is created on the distributed storage array with metadata 852 that includes dictionary ID 814. Similarly, as created on a distributed storage array, storage block 820 includes metadata 822, and the metadata includes a dictionary ID 824. Here, dictionary ID 824 identifies a dictionary 842 that is logically prepended to storage block 820 during compression. The modified LZ4 block compression algorithm is then utilized to compress storage block 820 into LZ4 block 860. LZ4 block 860 is created on the distributed storage array with metadata 862 that includes dictionary ID 824.

Here, in a limiting case, where dictionary ID 814 and dictionary ID 824 each point to a common dictionary, that is, that dictionary 840 and dictionary 842 are equivalent, then the present embodiment devolves to being functionally similar to the case described with respect to FIG. 7, and dictionary 840 can be provided in each node of the distributed storage array as the common dictionary. However, in a more general case, dictionary ID 814 can point to a different dictionary than dictionary ID 824, that is, dictionary 840 can be different from dictionary 842. Here, each node of the distributed storage array can include copies of multiple dictionaries, and each storage block can be compressed using the modified LZ4 block compression algorithm, but also can utilize different dictionaries that may be optimized to the type of data of each storage block. Further, the inclusion of the dictionary IDs in the metadata 852 and 862 for respective LZ4 blocks 850 and 860 permits the distributed storage array to decompress each LZ4 block with the necessary dictionary.

FIG. 9 illustrates another embodiment of a modified LZ4 block compression algorithm for compressing storage blocks 810 and 820. Here, storage block 810 includes metadata 812 with dictionary ID 814 that identifies dictionary 840. Further, storage block 820 includes metadata 822 with dictionary ID 824 that also identifies dictionary 840. Here, because both of dictionary IDs 814 and 824 identify a common dictionary 840, storage block 820 is appended to storage block 810 to form a combined block 830. Dictionary 840 is prepended to block 830, and the modified LZ4 compression algorithm is then utilized to compress block 830 into LZ4 block 850. LZ4 block 850 is created on the distributed storage array with metadata 852 that includes dictionary ID 814, or, equivalently, dictionary ID 824. In this way, multiple storage blocks can be compressed using the modified LZ4 compression algorithm, without the need to invoke the LZ4 frame mechanism.

Figure 10:
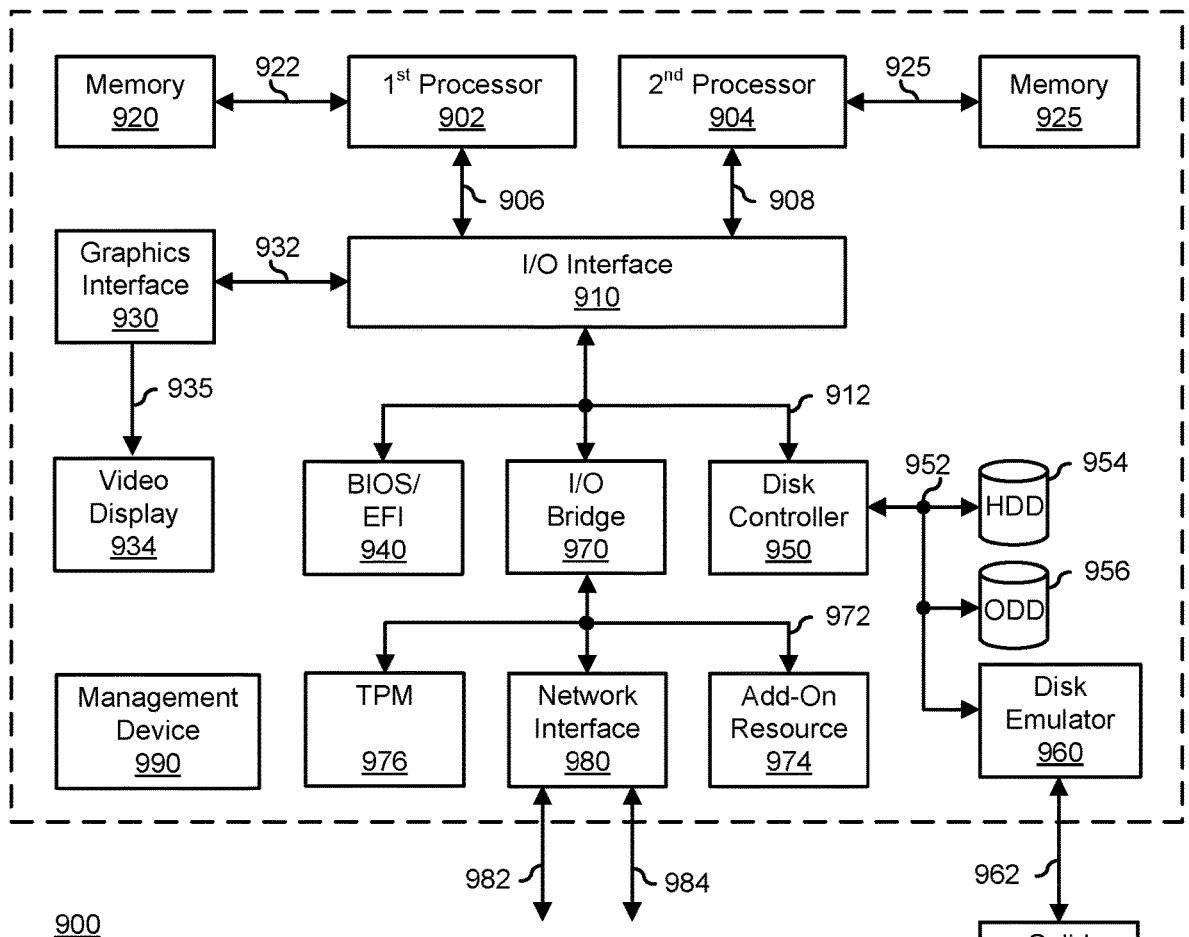
FIG. 10 is a block diagram illustrating a generalized information handling system according to another embodiment of the present disclosure.

FIG. 10 illustrates a generalized embodiment of an information handling system 900. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 900 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 900 can include processing resources for executing machine-executable code, such as a central processing unit (CPU), a programmable logic array (PLA), an embedded device such as a System-on-a-Chip (SoC), or other control logic hardware. Information handling system 900 can also include one or more computer-readable medium for storing machine-executable code, such as software or data. Additional components of information handling system 900 can include one or more storage devices that can store machine-executable code, one or more communications ports for communicating with external devices, and various input and output (I/O) devices, such as a keyboard, a mouse, and a video display. Information handling system 900 can also include one or more buses operable to transmit information between the various hardware components.

Information handling system 900 can include devices or modules that embody one or more of the devices or modules described below, and operates to perform one or more of the methods described below. Information handling system 900 includes a processors 902 and 904, an input/output (I/O) interface 910, memories 920 and 925, a graphics interface 930, a basic input and output system/universal extensible firmware interface (BIOS/UEFI) module 940, a disk controller 950, a hard disk drive (HDD) 954, an optical disk drive (ODD) 956, a disk emulator 960 connected to an external solid state drive (SSD) 962, an I/O bridge 970, one or more add-on resources 974, a trusted platform module (TPM) 976, a network interface 980, a management device 990, and a power supply 995. Processors 902 and 904, I/O interface 910, memory 920, graphics interface 930, BIOS/UEFI module 940, disk controller 950, HDD 954, ODD 956, disk emulator 960, SSD 962, I/O bridge 970, add-on resources 974, TPM 976, and network interface 980 operate together to provide a host environment of information handling system 900 that operates to provide the data processing functionality of the information handling system. The host environment operates to execute machine-executable code, including platform BIOS/UEFI code, device firmware, operating system code, applications, programs, and the like, to perform the data processing tasks associated with information handling system 900.

In the host environment, processor 902 is connected to I/O interface 910 via processor interface 906, and processor 904 is connected to the I/O interface via processor interface 908. Memory 920 is connected to processor 902 via a memory interface 922. Memory 925 is connected to processor 904 via a memory interface 927. Graphics interface 930 is connected to I/O interface 910 via a graphics interface 932, and provides a video display output 936 to a video display 934. In a particular embodiment, information handling system 900 includes separate memories that are dedicated to each of processors 902 and 904 via separate memory interfaces. An example of memories 920 and 930 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 940, disk controller 950, and I/O bridge 970 are connected to I/O interface 910 via an I/O channel 912. An example of I/O channel 912 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 910 can also include one or more other I/O interfaces, including an Industry Standard Architecture (ISA) interface, a Small Computer Serial Interface (SCSI) interface, an Inter-Integrated Circuit (I²C) interface, a System Packet Interface (SPI), a Universal Serial Bus (USB), another interface, or a combination thereof. BIOS/UEFI module 940 includes BIOS/UEFI code operable to detect resources within information handling system 900, to provide drivers for the resources, initialize the resources, and access the resources. BIOS/UEFI module 940 includes code that operates to detect resources within information handling system 900, to provide drivers for the resources, to initialize the resources, and to access the resources.

Disk controller 950 includes a disk interface 952 that connects the disk controller to HDD 954, to ODD 956, and to disk emulator 960. An example of disk interface 952 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 960 permits SSD 964 to be connected to information handling system 900 via an external interface 962. An example of external interface 962 includes a USB interface, an IEEE 1394 (Firewire) interface, a proprietary interface, or a combination thereof. Alternatively, solid-state drive 964 can be disposed within information handling system 900.

I/O bridge 970 includes a peripheral interface 972 that connects the I/O bridge to add-on resource 974, to TPM 976, and to network interface 980. Peripheral interface 972 can be the same type of interface as I/O channel 912, or can be a different type of interface. As such, I/O bridge 970 extends the capacity of I/O channel 912 when peripheral interface 972 and the I/O channel are of the same type, and the I/O bridge translates information from a format suitable to the I/O channel to a format suitable to the peripheral channel 972 when they are of a different type. Add-on resource 974 can include a data storage system, an additional graphics interface, a network interface card (NIC), a sound/video processing card, another add-on resource, or a combination thereof. Add-on resource 974 can be on a main circuit board, on separate circuit board or add-in card disposed within information handling system 900, a device that is external to the information handling system, or a combination thereof.

Network interface 980 represents a NIC disposed within information handling system 900, on a main circuit board of the information handling system, integrated onto another component such as I/O interface 910, in another suitable location, or a combination thereof. Network interface device 980 includes network channels 982 and 984 that provide interfaces to devices that are external to information handling system 900. In a particular embodiment, network channels 982 and 984 are of a different type than peripheral channel 972 and network interface 980 translates information from a format suitable to the peripheral channel to a format suitable to external devices. An example of network channels 982 and 984 includes InfiniBand channels, Fibre Channel channels, Gigabit Ethernet channels, proprietary channel architectures, or a combination thereof. Network channels 982 and 984 can be connected to external network resources (not illustrated). The network resource can include another information handling system, a data storage system, another network, a grid management system, another suitable resource, or a combination thereof.

Management device 990 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 900. In particular, management device 990 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 900, such as system cooling fans and power supplies. Management device 990 can include a network connection to an external management system, and the management device can communicate with the management system to report status information for information handling system 900, to receive BIOS/UEFI or system firmware updates, or to perform other task for managing and controlling the operation of information handling system 900. Management device 990 can operate off of a separate power plane from the components of the host environment so that the management device receives power to manage information handling system 900 when the information handling system is otherwise shut down. An example of management device 990 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 990 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system, comprising:
a data storage device including a first dictionary and a first uncompressed data block; and
a processor configured to:
prepend the first dictionary to the first uncompressed data block;
determine, from the first uncompressed data block, a first literal data string and a first match data string, the first match data string being a first matching entry of the first dictionary; and
compress the first uncompressed data block into a first compressed data block that includes the first literal data string and a first offset pointer, the first offset pointer having a first offset that is greater than an offset of a start of the first literal data string and that points to the first matching entry in the prepended first dictionary.

2. The information handling system of claim 1, wherein the processor is further configured to:
determine, from the first uncompressed data block, a second literal data string and a second match data string, the second match data string being a matching entry of a sliding window; and
further compress the first uncompressed data block into the first compressed data block that further includes the second literal data string and a second offset pointer, the second offset pointer having a second offset that is less than the offset of the start of the first literal data string and that points into the sliding window.

3. The information handling system of claim 1, wherein the processor is further configured to:
append a second uncompressed data block to the first uncompressed data block;
determine, from the second uncompressed data block, a second literal data string and a second match data string, the second match data string being a second matching entry of the first dictionary; and
compress the second uncompressed data block into the first compressed data block that further includes the second literal data string and a second offset pointer that points to the second matching entry.

4. The information handling system of claim 1, wherein first block metadata associated with the first uncompressed data block includes information that identifies the first dictionary.

5. The information handling system of claim 4, wherein second block metadata associated with the first compressed data block includes the information.

6. The information handling system of claim 1, wherein the first compressed data block includes information that identifies the first dictionary.

7. The information handling system of claim 6, wherein the information is included in a first in order sequence of the first compressed data block.

8. The information handling system of claim 1, wherein the processor is further configured to:
prepend a second dictionary to a second uncompressed data block;
determine, from the second uncompressed data block, a second literal data string and a second match data string, the second match data string being a second matching entry of the second dictionary; and
compress the second uncompressed data block into a second compressed data block that includes the second literal data string and a second offset pointer that points to the second matching entry.

9. The information handling system of claim 1, wherein, in compressing the first uncompressed data block, the processor utilizes an LZ4 data compression algorithm.

10. A data storage device for a distributed storage array, the data storage device comprising:
a data interface for receiving a first dictionary and a first uncompressed data block; and
a processor configured to instantiate a data compressor, the data compressor to:
prepend the first dictionary to the first uncompressed data block;
determine, from the first uncompressed data block, a first literal data string and a first match data string, the first match data string being a first matching entry of the first dictionary; and
compress the first uncompressed data block into a first compressed data block that includes the first literal data string and a first offset pointer, the first offset pointer having a first offset that is greater than an offset of a start of the first literal data string and that points to the first matching entry in the prepended first dictionary.

11. A method, comprising:
prepending a first dictionary to a first uncompressed data block;
determining, from the first uncompressed data block, a first literal data string and a first match data string, the first match data string being a first matching entry of the first dictionary; and
compressing the first uncompressed data block into a first compressed data block that includes the first literal data string and a first offset pointer, the first offset pointer having a first offset that is greater than an offset of a start of the first literal data string and that points to the first matching entry in the prepended first dictionary.

12. The method of claim 11, further comprising:
determining, from the first uncompressed data block, a second literal data string and a second match data string, the second match data string being a matching entry of a sliding window; and
further compressing the first uncompressed data block into the first compressed data block that further includes the second literal data string and a second offset pointer, the second offset pointer having a second offset that is less than the offset of the start of the first literal data string and that points into the sliding window.

13. The method of claim 11, further comprising:
receiving the first dictionary from a device configured to perform the compressing.

14. The method of claim 13, further comprising:
appending a second uncompressed data block to the first uncompressed data block;
determining, from the second uncompressed data block, a second literal data string and a second match data string, the second match data string being a second matching entry of the first dictionary; and
compressing the second uncompressed data block into the first compressed data block that further includes the second literal data string and a second offset pointer that points to the second matching entry.

15. The method of claim 11, wherein first block metadata associated with the first uncompressed data block includes information that identifies the first dictionary.

16. The method of claim 15, wherein second block metadata associated with the first compressed data block includes the information.

17. The method of claim 11, wherein the first compressed data block includes information that identifies the first dictionary.

18. The method of claim 17, wherein the information is included in a first in order sequence of the first compressed data block.

19. The method of claim 11, further comprising:
prepending a second dictionary to a second uncompressed data block;
determining, from the second uncompressed data block, a second literal data string and a second match data string, the second match data string being a second matching entry of the second dictionary; and
compressing the second uncompressed data block into a second compressed data block that includes the second literal data string and a second offset pointer that points to the second matching entry.

20. The method of claim 11, wherein, in compressing the first uncompressed data block, an LZ4 data compression algorithm compressed the first uncompressed data block.

* * * * *